(12) United States Patent
Byun et al.

(10) Patent No.: US 7,456,063 B2  
(45) Date of Patent: Nov. 25, 2008

(54) LAYOUT METHOD OF POWER LINE FOR SEMICONDUCTOR INTEGRATED CIRCUIT AND SEMICONDUCTOR INTEGRATED CIRCUIT MANUFACTURED BY THE LAYOUT METHOD

(75) Inventors: Sang Jin Byun, Daejeon (KR); Hyun Kyu Yu, Daejeon (KR)

(73) Assignee: Electronics and Telecommunications Research Institute, Daejeon (KR)

( * ) Notice: Subject to any disclaimer, the term of this patent is extended or adjusted under 35 U.S.C. 154(b) by 0 days.

(21) Appl. No.: 11/523,212

(22) Filed: Sep. 19, 2006

(65) Prior Publication Data
US 2007/0134852 A1 Jun. 14, 2007

(30) Foreign Application Priority Data
Dec. 8, 2005 (KR) .................. 10-2005-0120038
May 19, 2006 (KR) .................. 10-2006-0044931

(51) Int. Cl.
*H01L 21/8242* (2006.01)

(52) U.S. Cl. .................. 438/239; 438/250; 438/251; 257/E21.048; 257/E21.19

(58) Field of Classification Search .................. 438/239, 438/250–252; 257/E21.048, E21.19, E21.396
See application file for complete search history.

(56) References Cited

U.S. PATENT DOCUMENTS 5,789,807 A 8/1998 Correale, Jr.
6,146,939 A * 11/2000 Dasgupta .................. 438/251
6,881,996 B2 * 4/2005 Chen et al. .................. 257/296
2005/0071798 A1 3/2005 Chung et al.
2006/0128092 A1 * 6/2006 Rouse .................. 438/239

FOREIGN PATENT DOCUMENTS

| JP | 2004-119709 | 4/2004 |
| JP | 2005-116587 | 4/2005 |
| JP | 2005-175003 | 6/2005 |
| KR | 102001 0059851 | 7/2001 |
| KR | 102002 0077040 | 10/2002 |

* cited by examiner

*Primary Examiner*—Matthew E Warren
(74) *Attorney, Agent, or Firm*—Ladas & Parry LLP

(57) ABSTRACT

Provided are a layout method of a power line for a semiconductor integrated circuit and a semiconductor integrated circuit manufactured by the layout method. The layout method includes the steps of: forming a decoupling capacitor on a substrate; laying out a first metal layer, connected to the decoupling capacitor through a contact, above a region where the decoupling capacitor is formed so as to cover the decoupling capacitor; and laying out a second metal layer above a region where the first metal layer is formed. Therefore, the metal layers and the decoupling capacitor are laid out in the same region so that a chip area can be prevented from being additionally consumed at the time of laying out the decoupling capacitor, and degradation which may occur due to connection line resistance from the power lines to the decoupling capacitors can be prevented.

5 Claims, 9 Drawing Sheets

LAYOUT METHOD OF POWER LINE FOR SEMICONDUCTOR INTEGRATED CIRCUIT AND SEMICONDUCTOR INTEGRATED CIRCUIT MANUFACTURED BY THE LAYOUT METHOD

CROSS-REFERENCE TO RELATED APPLICATION

This application claims priority to and the benefit of Korean Patent Application Nos. 2005-120038, filed Dec. 8, 2005 and 2006-44931, filed May 19, 2006, the disclosures of which are incorporated herein by reference in their entirety.

BACKGROUND

1. Field of the Invention

The present invention relates to a layout method of a power line for a semiconductor integrated circuit and a semiconductor integrated circuit manufactured by the layout method, and more particularly, to a layout method of a power line for a semiconductor integrated circuit where a power line and a decoupling capacitor constituting the semiconductor integrated circuit are arranged in the same region, and a semiconductor integrated circuit manufactured by the layout method.

2. Discussion of Related Art

In general, various researches on layout methods for power lines and semiconductor devices are done in a semiconductor integrated circuit. Hereinafter, the layout of a conventional semiconductor integrated circuit will be described with reference to the accompanying drawings.

FIG. 1 illustrates a power line layout of a conventional semiconductor integrated circuit including a power line and a decoupling capacitor (refer to Korean Patent Publication No. 2002-0077040 entitled "semiconductor integrated circuit and layout design method of power line"), and FIG. 2 illustrates a power line layout of another conventional semiconductor integrated circuit including a power line and a decoupling capacitor (refer to U.S. Patent Publication No. 2005/0071798 entitled "Power supply layout for an integrated circuit").

Referring to FIG. 1, power lines 101 and 102 (VDD and GND) surround a core 103 of a semiconductor integrated circuit 100, and a decoupling capacitor 104 for reducing noises of the power lines 101 and 102 is arranged within the core 103 of the semiconductor integrated circuit 100. Referring to FIG. 2, power lines 201 and 202 (VDD and GND) are arranged in a lattice form, and a decoupling capacitor 204 for reducing noises of the power lines 201 and 202 is arranged within a core 203 in the same manner as FIG. 1.

Referring to FIGS. 1 and 2, the decoupling capacitors 104 and 204 are arranged in regions separated from regions where the power lines 101, 102, 201, and 202 are arranged within the semiconductor integrated circuits 100 and 200, i.e., in regions different from the regions where the power lines are arranged, so that the decoupling capacitors 104 and 204 disadvantageously occupy some regions of the cores 103 and 203. Further, when capacitances of the decoupling capacitors 104 and 204 increase, areas occupied by the decoupling capacitors 104 and 204 in the respective cores 103 and 203 increase by the increased amount of the capacitors. When the decoupling capacitors 104 and 204 are arranged, functions of the decoupling capacitors 104 and 204 are degraded due to connection line resistance from the power lines 101, 102, 201, and 202 to the decoupling capacitors 104 and 204.

To cope with the problems resulting from FIGS. 1 and 2, a parasitic capacitor formed between power lines formed of metal (i.e., a capacitor of which charge capacitance is accumulated between power lines as power is applied between the power lines) may be used. FIG. 3 illustrates a layout for increasing a parasitic capacitor between power lines in a conventional semiconductor integrated circuit (refer to U.S. Pat. No. 5,789,807 entitled "On-chip power distribution for improved decoupling"). Referring to FIG. 3, power lines 301 and 302 (VDD and GND) are cross-coupled in a semiconductor integrated circuit 300, so that a parasitic capacitor formed between the power lines can be used as a decoupling capacitor.

However, when the semiconductor integrated circuit 300 is arranged as shown in FIG. 3, capacitance of the capacitor is relatively smaller compared to the case that the decoupling capacitor is arranged in a separate region of the core as shown in FIGS. 1 and 2, so that the capacitor having a sufficient capacitance cannot be provided.

SUMMARY OF THE INVENTION

The present invention is directed to a layout method of a power line for a semiconductor integrated circuit and a semiconductor integrated circuit manufactured by the layout method, which have a power line and a decoupling capacitor arranged in the same region to prevent a chip area from being additionally consumed at the time of layout of the decoupling capacitor.

The present invention is also directed to a layout method of a power line for a semiconductor integrated circuit and a semiconductor integrated circuit manufactured by the layout method that are capable of preventing a function of a decoupling capacitor from being degraded due to connection line resistance from the power line to the decoupling capacitor.

One aspect of the present invention provides a layout method of a power line for a semiconductor integrated circuit, including the steps of: forming a decoupling capacitor on a substrate; laying out a first metal layer, connected to the decoupling capacitor through a contact, above a region where the decoupling capacitor is formed so as to cover the decoupling capacitor; and laying out a second metal layer above a region where the first metal layer is formed.

The first metal layer may include a slot penetrating the first metal layer, and a slot metal formed within the slot and formed of the same metal as the first metal layer. The slot metal may be connected to the second metal layer through a via. The decoupling capacitor may use a P-type Metal Oxide Semiconductor (MOS) transistor structure, an NMOS transistor structure, or a combination thereof. When the decoupling capacitor uses the PMOS transistor structure, the first metal may be used as a VDD power line, and the second metal layer may be used as a GND power line. When the decoupling capacitor uses the NMOS transistor structure, the first metal may be used as a GND power line, and the second metal layer may be used as a VDD power line. The decoupling capacitor may include a poly-gate connected to the slot metal through a contact.

Another aspect of the present invention provides a semiconductor integrated circuit manufactured by the layout method of a power line according to one aspect of the invention.

BRIEF DESCRIPTION OF THE DRAWINGS

The above and other features and advantages of the present invention will become more apparent to those of ordinary skill in the art by describing in detail preferred embodiments thereof with reference to the attached drawings in which.

DETAILED DESCRIPTION OF PREFERRED EMBODIMENTS

Hereinafter, an exemplary embodiment of the present invention will be described in detail. However, the present invention is not limited to the embodiments disclosed below, but can be implemented in various types. Therefore, the present embodiment is provided for complete disclosure of the present invention and to fully inform the scope of the present invention to those ordinarily skilled in the art.

Figure 1:
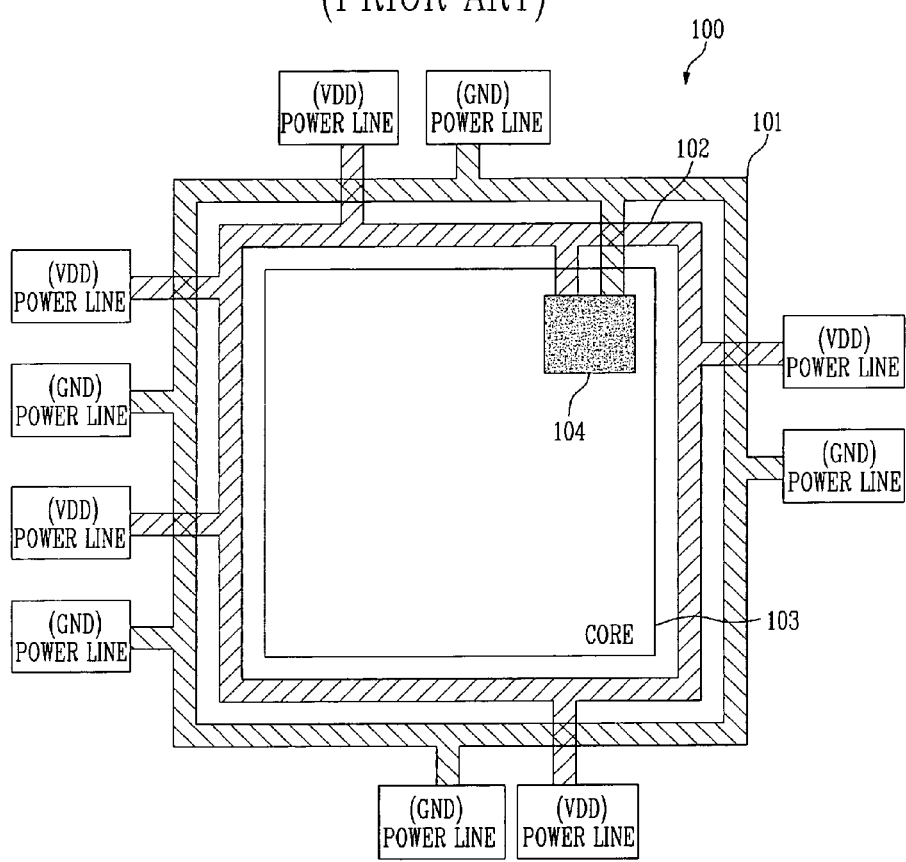
FIG. 1 illustrates a power line layout of a conventional semiconductor integrated circuit including a power line and a decoupling capacitor.
Figure 2:
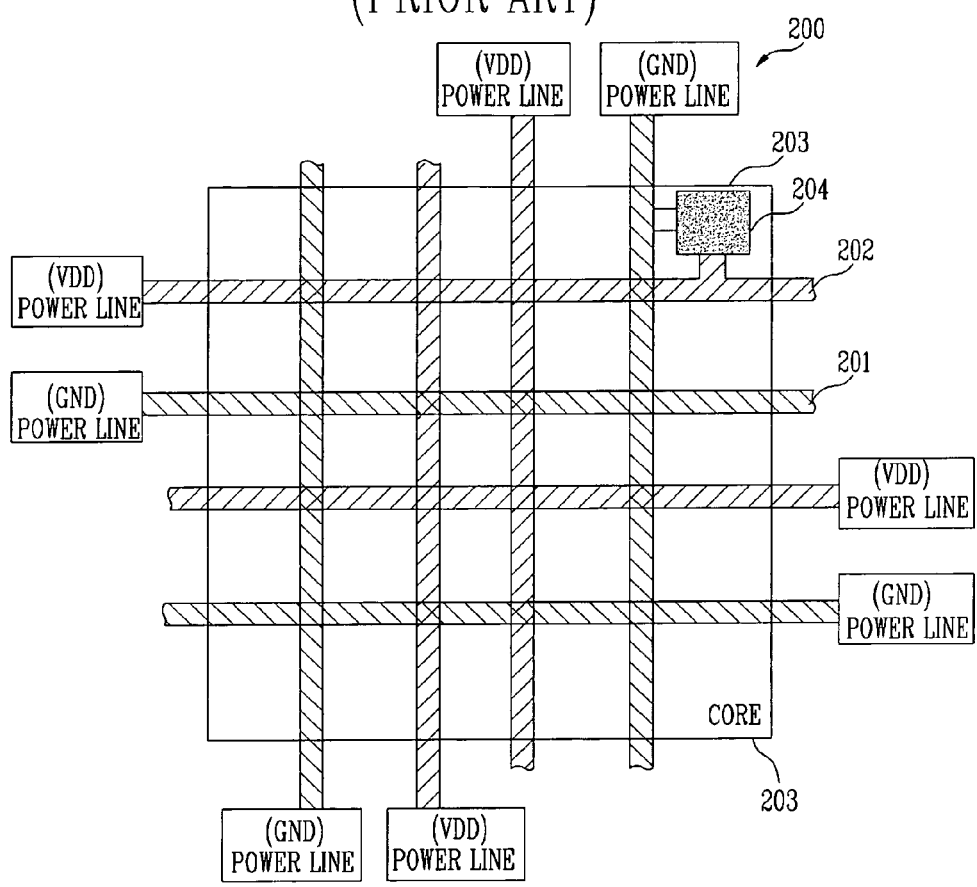
FIG. 2 illustrates a power line layout of another conventional semiconductor integrated circuit including a power line and a decoupling capacitor.
Figure 3:
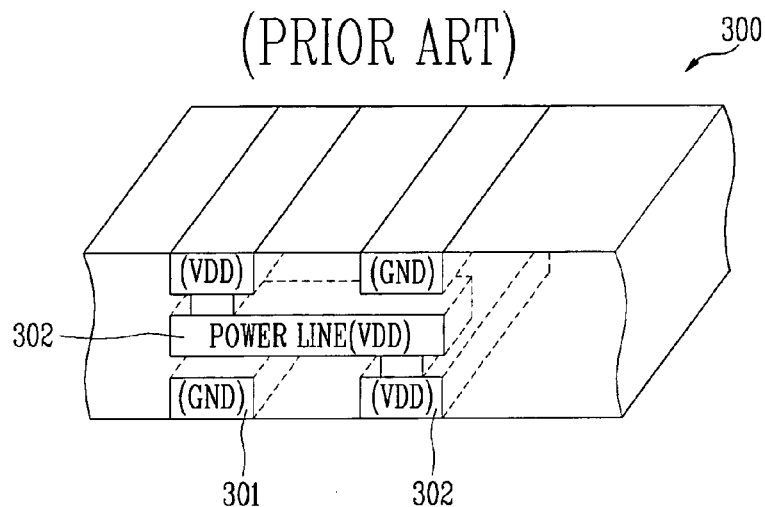
FIG. 3 illustrates a layout for increasing a parasitic capacitor between power lines in a conventional semiconductor integrated circuit.
Figure 4A:
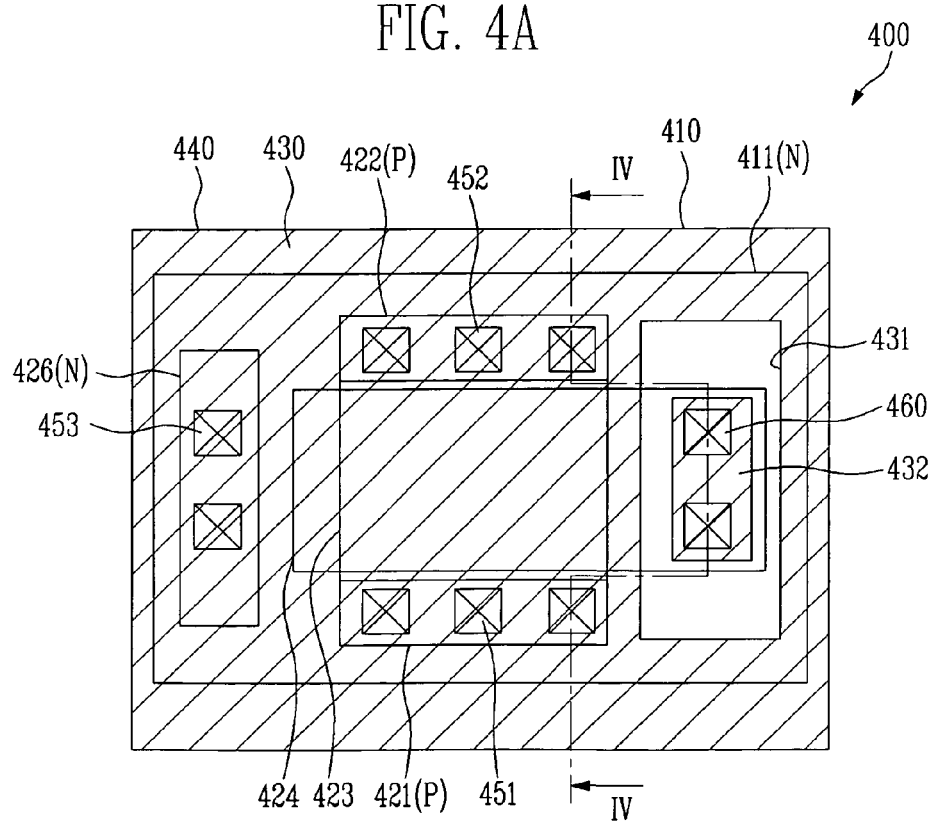
FIG. 4A illustrates a power line layout of a semiconductor integrated circuit in accordance with an exemplary embodiment of the present invention.
Figure 4B:
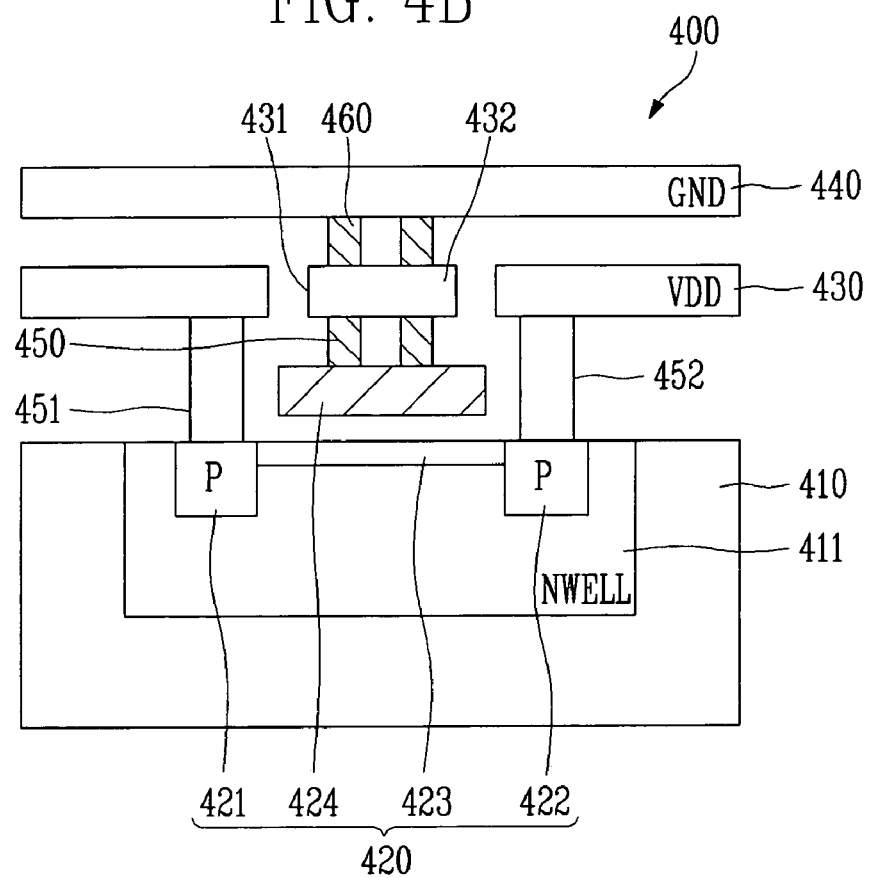
FIG. 4B is a partial cross-sectional view taken along line IV-IV of FIG. 4A.

FIG. 4A illustrates a power line layout of a semiconductor integrated circuit in accordance with an exemplary embodiment of the present invention, and FIG. 4B is a partial cross-sectional view taken along line IV-IV of FIG. 4A. Referring to FIGS. 4A and 4B, a decoupling capacitor 400 of the present invention includes a transistor structure 420, and a pair of metal layers 430 and 440 formed in the same region as the transistor structure 420 and electrically connected to the transistor structure 420.

The transistor structure 420 constituting the decoupling capacitor 400 is classified as a PMOS or NMOS decoupling capacitor in accordance with a PMOS or NMOS type. The transistor structure 420 illustrated in FIGS. 4A and 4B is a PMOS type, so that the decoupling capacitor 400 is a PMOS decoupling capacitor. When the decoupling capacitor 400 is a PMOS decoupling capacitor, the first metal layer 430 formed above the transistor structure 420 is used as a VDD power line, and the second metal layer 440 formed above the first metal layer 430 is used as a GND power line.

To detail this, the PMOS transistor structure 420 constituting the PMOS decoupling capacitor 400 includes a substrate 410, source and drain regions 421 and 422, a channel region 423, and a poly-gate 424. In this case, the substrate 410 is a P type substrate, and an N-well 411 is formed in the P type substrate 410. The source and drain regions 421 and 422 as P type diffusion regions, and an N type diffusion region 426 (see FIG. 4A) are formed in the N-well 411 region. The channel region 423 is formed between the source and drain regions 421 and 422, and the poly-gate 424 is formed above the source and drain regions 421 and 422 and the channel region 423. Meanwhile, a slot 431 is formed in a region of the first metal layer 430, and a slot metal 432 formed of the same metal as the first metal layer 430 and smaller than the slot 431 is formed within the slot 431.

The source and drain regions 421 and 422 constituting the PMOS decoupling capacitor 400 as described above are electrically connected to the first metal layer 430, i.e., the VDD power line through contacts 451 and 452 formed therebetween. The poly-gate 424 is connected to the second metal layer 440 as the GND power line, to detail this, the poly-gate 424 is first connected to the slot metal 432 formed within the slot 431 through a contact 450 and then the slot metal 432 is connected to the second metal layer 440 through a via 460.

Figure 5:
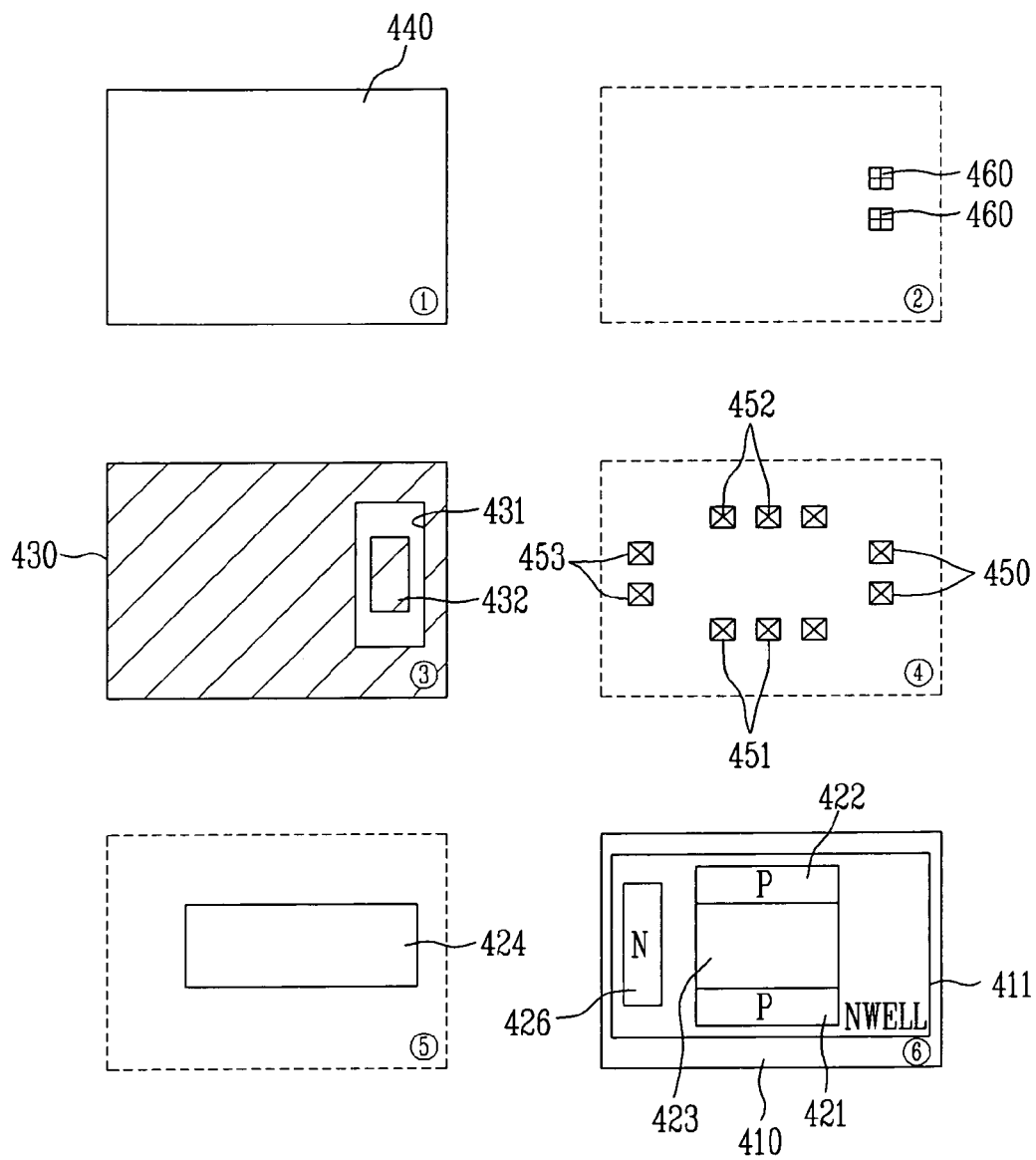
FIG. 5 is a plan view of a power line layout of the semiconductor integrated circuit of FIG. 4B.

FIG. 5 is a plan view of a power line layout of the semiconductor integrated circuit of FIG. 4B. Referring to FIG. 5, a plan view from the second metal layer 440 as a top layer to the substrate 410 as a bottom layer is illustrated.

First, the top layer ① is the second metal layer 440 used as a power line. A slot (not shown) for meeting layout requirements of a MOS (CMOS) process may be formed in the second metal layer 440.

A lower layer ③ of the second metal layer 440 is the first metal layer 430 used as a power line. The first metal layer 430 is formed below a region where the second metal layer 440 is formed. That is, the first metal layer 430 is formed in the same region as the second metal layer 440, and has the slot 431 penetrated therethrough. The slot metal 432 formed of the same metal as the first metal layer 430 and smaller than the slot is formed within the slot 431. The via 460 for connecting the first metal layer 430 and the second metal layer 440 is formed therebetween (②). The via 460 connects the second metal layer 440 to the slot metal 432 formed within the first metal layer 430. The poly-gate 424 as a constitutional component of the transistor structure is then formed in a lower layer (⑤) of the first metal layer 430, and connected to the slot metal 432 through the contact 450 (④) formed between the poly-gate 424 and the slot metal 432.

The substrate 410 where the N-well 411 is formed is disposed in a lower layer ⑥ of the poly-gate 424. P type source and drain regions 421 and 422, a channel region 423, and an N type diffusion region 426 are formed in the N-well 411 of the substrate 410. The source and drain regions 421 and 422 are connected to the first metal layer 430 through the contacts 451 and 452 (④) formed between the first metal layer 430 and the substrate 410. The N diffusion region 426 is connected to the first metal layer 430 through a contact 453 (④) formed between the first metal layer 430 and the substrate 410.

Figure 6A:
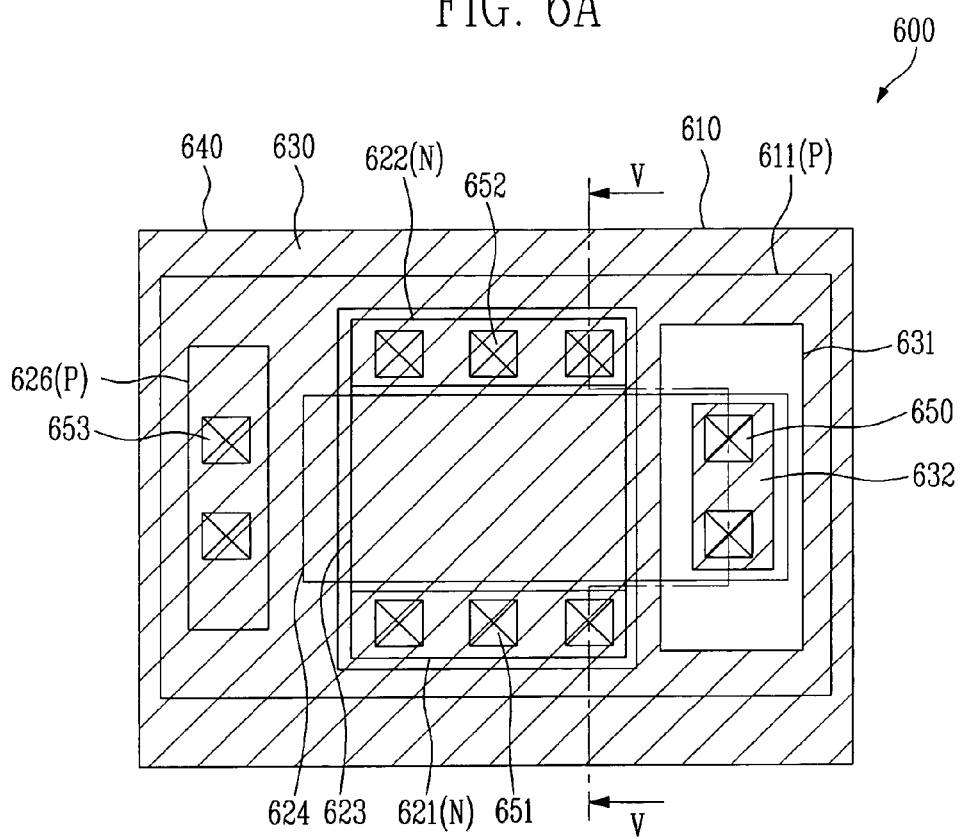
FIG. 6A illustrates a power line layout of a decoupling capacitor in accordance with another exemplary embodiment of the present invention.
Figure 6B:
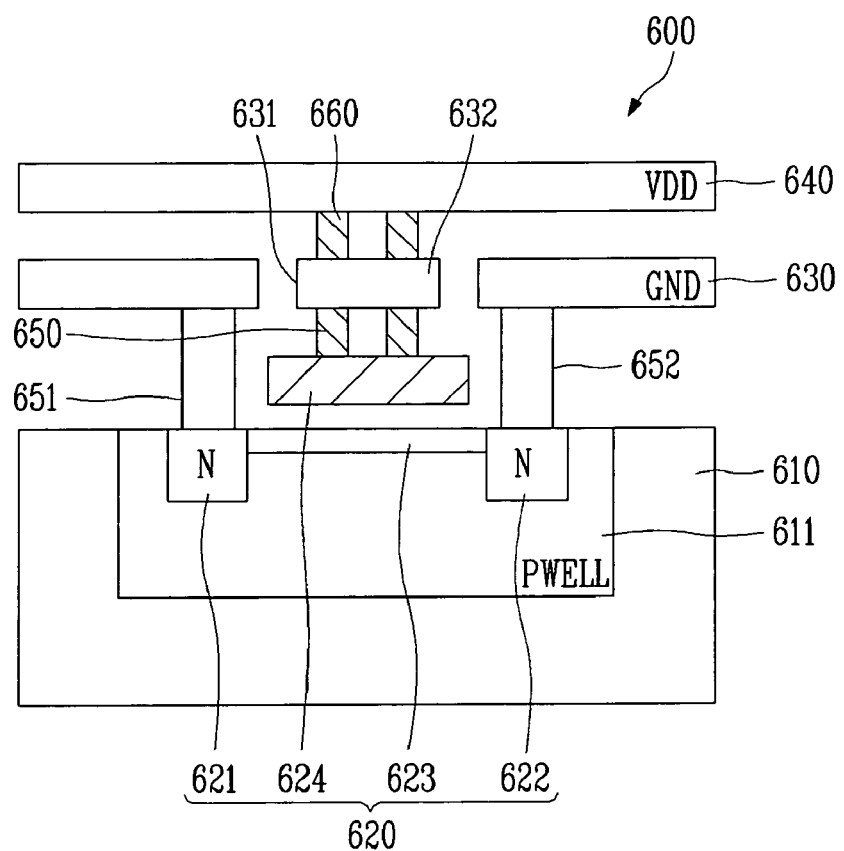
FIG. 6B is a partial cross-sectional view taken along line V-V of FIG. 6A.

FIG. 6A illustrates a power line layout of a decoupling capacitor in accordance with another exemplary embodiment of the present invention, and FIG. 6B is a partial cross-sectional view taken along line V-V of FIG. 6A. Referring to FIGS. 6A and 6B, a decoupling capacitor 600 of the present invention includes a transistor structure 620, and a pair of metal layers 630 and 640 which are formed in the same region as the region where the transistor structure 620 is formed and electrically connected to the transistor structure 620.

The decoupling capacitor 600 shown in FIGS. 6A and 6B is an NMOS decoupling capacitor. When the decoupling capacitor 600 is an NMOS decoupling capacitor, the first metal layer 630 formed above the transistor structure 620 is used as a GND power line, and the second metal layer 640 formed above the first metal layer 630 is used as a VDD power line.

The NMOS transistor structure 620 constituting the NMOS decoupling capacitor 600 includes a substrate 610, source and drain regions 621 and 622, a channel region 623, and a poly-gate 624. In this case, the substrate 610 is an N type substrate, a P-well 611 is formed in the N type substrate 610, and the source and drain regions 621 and 622 as N type diffusion regions and a P type diffusion region 626 are formed in the P-well 611 (see FIG. 6A).

The channel region 623 is formed between the source and drain regions 621 and 622, and the poly-gate 624 is formed above the source and drain regions 621 and 622 and the channel region 623. Meanwhile, a slot 631 is formed in a region of the first metal layer 630, and a slot metal 632 formed of the same metal as the first metal layer 630 and having a small square shape is formed within the slot 631.

The source and drain regions 621 and 622 of the NMOS decoupling capacitor 600 are connected to the first metal layer 630, i.e., a GND power line, and the poly-gate 624 is connected to the second metal layer 640, i.e., a VDD power line. In this case, the source and drain regions 621 and 622 are connected to the first metal layer 630 through contacts 651 and 652 formed therebetween. The poly-gate 624 is first connected to the slot metal 632 formed within the slot 631 through a contact 650 and then connected to the second metal layer 640 through a via 660.

In the above-described embodiments, PMOS and NMOS transistor structures are used to manufacture the decoupling capacitor, however, a Metal-Insulator-Metal (MIM) transistor structure or a poly-transistor structure as well as the PMOS and NMOS transistor structures may be employed to manufacture the decoupling capacitor. However, the PMOS and NMOS transistor structures have a greater capacitance of the capacitor per unit area than the MIM transistor structure or poly-transistor structure, so that the PMOS and NMOS transistor structures are preferably used.

Figure 7:
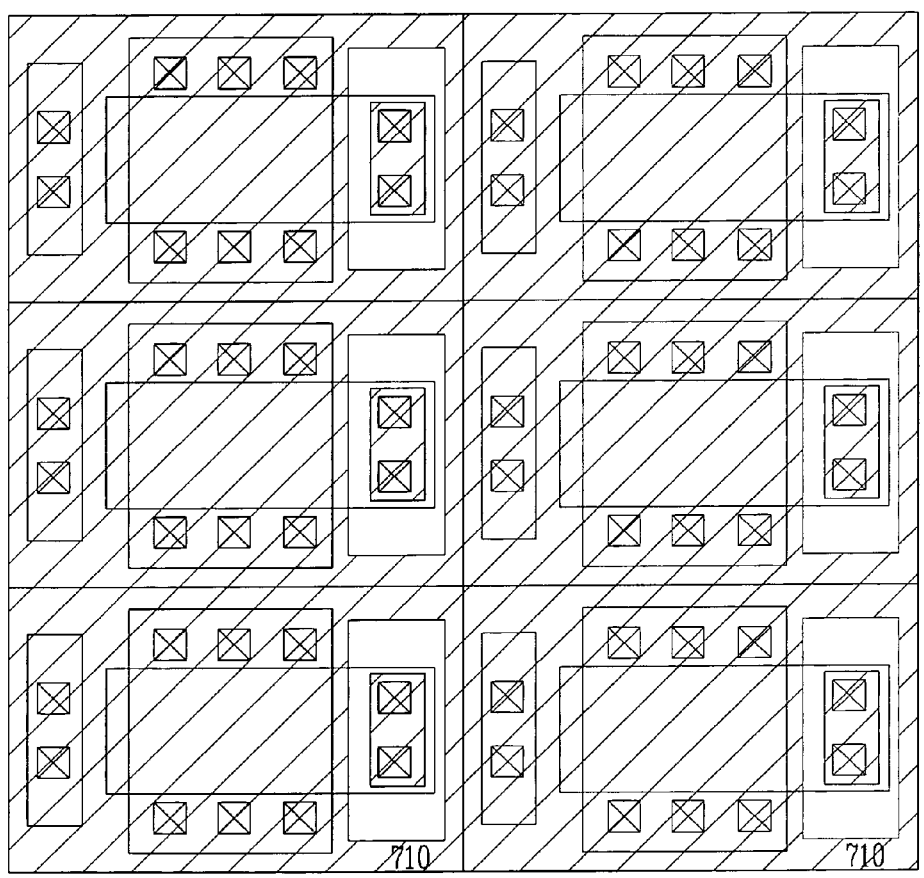
FIG. 7 illustrates a layout of a power line and a decoupling capacitor arranged in the same region in a plurality of columns and rows in accordance with an exemplary embodiment of the present invention.

FIG. 7 illustrates a layout of a power line and a decoupling capacitor arranged in the same region in a plurality of columns and rows in accordance with an exemplary embodiment of the present invention. Referring to FIG. 7, a semiconductor integrated circuit 700 has a structure in which the decoupling capacitors 710 are simply combined and disposed in row and column directions. The decoupling capacitors 710 may be implemented as shown in FIGS. 4A and 4B or FIGS. 6A and 6B. The decoupling capacitors 710 are laid out in the same region as where the metal layers (i.e., power lines) are formed so that a separate region for laying out the decoupling capacitor is not required, and the plural decoupling capacitors are disposed so that large power lines required for the whole semiconductor integrated circuit can be provided, thereby improving device characteristics.

Figure 8:
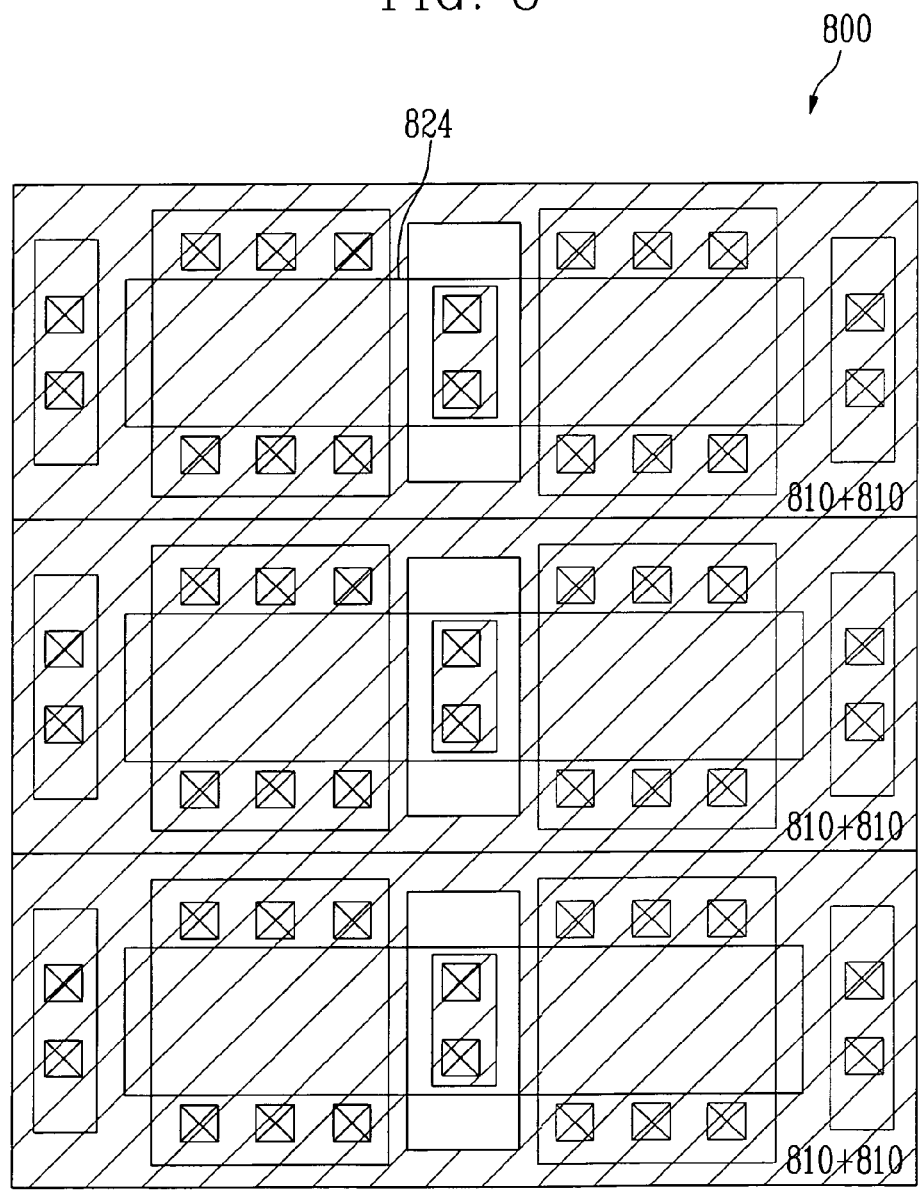
FIG. 8 illustrates a layout of a power line and a decoupling capacitor arranged in the same region in a plurality of columns and rows in accordance with another embodiment of the present invention.

FIG. 8 illustrates a layout of a power line and a decoupling capacitor arranged in the same region in a plurality of columns and rows in accordance with another exemplary embodiment of the present invention. Referring to FIG. 8, the plural decoupling capacitors 810 are laid out in row and column directions, and the most significant feature of FIG. 8 lies in that a pair of decoupling capacitors 810 share the poly-gate 824. The decoupling capacitors 810 may be implemented as shown in FIGS. 4A and 4B or FIGS. 6A and 6B. Also in the present embodiment, the decoupling capacitors 810 are laid out in the same region as the power lines so that a separate region for laying out the decoupling capacitor is not required, and large power lines required for the semiconductor integrated circuit can be provided so that device characteristics can be improved.

As described above, power lines are laid out above a region where decoupling capacitors are formed in accordance with the present invention, that is, the power lines and the decoupling capacitor are laid out in the same region, so that a chip area can be prevented from being additionally consumed at the time of laying out the decoupling capacitors.

In addition, degradation which may occur due to connection line resistance from the power lines to the decoupling capacitors can be prevented.

While the invention has been shown and described with reference to certain exemplary embodiments thereof, it will be understood by those skilled in the art that various changes in form and details may be made therein without departing from the spirit and scope of the invention as defined by the appended claims.

What is claimed is:

1. A layout method of a power line for a semiconductor integrated circuit, comprising the steps of:
    forming a decoupling capacitor on a substrate, wherein the decoupling capacitor comprises a MOS transistor having a gate and source/drain regions;
    laying out a first metal layer, connected to the source/drain regions of the decoupling capacitor through contacts, above a region where the decoupling capacitor is formed so as to cover the decoupling capacitor; and
    laying out a second metal layer above a region where the first metal layer is formed, the second metal layer being electrically connected to the gate,
    wherein the first metal layer comprises a slot penetrating the first metal layer and aligned with the gate of the decoupling capacitor, and a slot metal formed of the same metal as the first metal layer, formed within the slot and enclosed by the slot, the slot metal being connected to the gate of the decoupling capacitor through one or more contacts,
    wherein the second metal layer is separated by a predetermined distance from the first metal layer and connected to the slot metal through one or more vias.

2. The method of claim 1, wherein the decoupling capacitor uses a P-type Metal Oxide Semiconductor (MOS) transistor structure, an NMOS transistor structure, or a combination thereof.

3. The method of claim 2, wherein when the decoupling capacitor uses the PMOS transistor structure, the first metal layer is used as a VDD power line and the second metal layer is used as a GND power line.

4. The method of claim 2, wherein when the decoupling capacitor uses the NMOS transistor structure, the first metal layer is used as a GND power line and the second metal layer is used as a VDD power line.

5. A semiconductor integrated circuit manufactured by the layout method of a power line according to claim 1.

* * * * *